United States Patent
Haller

(10) Patent No.: US 6,739,881 B2
(45) Date of Patent: May 25, 2004

(54) HIGH INTEGRATION ELECTRONIC ASSEMBLY AND METHOD

(75) Inventor: Mark D. Haller, Canton, MI (US)

(73) Assignee: TRW Inc., Lyndhurst, OH (US)

( * ) Notice: Subject to any disclaimer, the term of this patent is extended or adjusted under 35 U.S.C. 154(b) by 155 days.

(21) Appl. No.: 09/871,192

(22) Filed: May 31, 2001

(65) Prior Publication Data

US 2002/0180259 A1 Dec. 5, 2002

(51) Int. Cl.[7] .............................................. H01R 9/09
(52) U.S. Cl. ...................................................... 439/78
(58) Field of Search .......................... 439/78, 83, 751, 439/876

(56) References Cited

U.S. PATENT DOCUMENTS

| | | | |
|---|---|---|---|
| 3,693,052 A | * | 9/1972 | Galanti ........................ 361/773 |
| 4,196,941 A | | 4/1980 | Goebels |
| 4,242,719 A | * | 12/1980 | Conley ......................... 361/760 |
| 4,586,778 A | | 5/1986 | Walter et al. |
| 4,651,416 A | * | 3/1987 | DePaul ......................... 29/837 |
| 4,686,607 A | * | 8/1987 | Johnson ....................... 361/788 |
| 4,688,328 A | * | 8/1987 | Jebens et al. ................. 29/839 |
| 4,828,335 A | | 5/1989 | Fuller et al. |
| 4,842,525 A | | 6/1989 | Galloway et al. |
| 4,916,457 A | * | 4/1990 | Foy et al. .................... 343/770 |
| 5,022,717 A | | 6/1991 | Heibel et al. |
| 5,076,796 A | * | 12/1991 | Kusayanagi et al. .......... 439/83 |
| 5,129,830 A | | 7/1992 | Krajewski et al. |
| 5,275,478 A | | 1/1994 | Schmitt et al. |
| 5,362,137 A | | 11/1994 | Kohno |
| 5,364,067 A | | 11/1994 | Linkner, Jr. |
| 5,374,114 A | | 12/1994 | Burgdorf et al. |
| 5,449,226 A | | 9/1995 | Fujita et al. |
| 5,449,227 A | | 9/1995 | Steinberg et al. |
| 5,464,344 A | | 11/1995 | Hufton |
| 5,470,260 A | | 11/1995 | Schwan et al. |
| 5,482,362 A | | 1/1996 | Robinson |
| 5,513,905 A | | 5/1996 | Zeides et al. |
| 5,520,447 A | | 5/1996 | Burgdorf et al. |
| 5,520,546 A | | 5/1996 | Klinger et al. |
| 5,695,259 A | | 12/1997 | Isshiki et al. |
| 5,715,595 A | | 2/1998 | Kman et al. |
| 5,758,931 A | | 6/1998 | Hio et al. |
| 5,761,050 A | | 6/1998 | Archer |
| 5,769,508 A | | 6/1998 | Gilles et al. |
| 6,124,772 A | | 9/2000 | Heise |
| 6,137,061 A | * | 10/2000 | Aponte et al. ............... 174/260 |
| 6,469,255 B2 | * | 10/2002 | Watanabe et al. ........... 174/254 |
| 6,494,754 B2 | * | 12/2002 | Cachina et al. .............. 439/876 |

OTHER PUBLICATIONS

Tsui et al., vol. 13 No. 6, Nov. 1970, IBM Technical Disclosure Bulletin.*

* cited by examiner

Primary Examiner—Lynn Feild
Assistant Examiner—Thanh-Tam Le
(74) Attorney, Agent, or Firm—Tarolli, Sundheim, Covell & Tummino L.L.P.

(57) ABSTRACT

An assembly (20) comprises a circuit board (30), a first component (40), and a second component (50). The circuit board (30) has a planar first surface (32) and a planar second surface (34) opposite the first surface (32). The first component (40) has a first set of connectors (42). The first set of connectors (42) engages a corresponding set of apertures (36) in the first surface (32) of the circuit board (30). The second component (50) has a second set of mechanical one-way connectors (52). The second set of connectors (52) engages a corresponding set of apertures (38) in the second surface (34) of the circuit board (30). The circuit board (30) further has a normal axis (39) perpendicular to both the first and second surfaces (32, 34). The normal axis (39) passes through both the first and second components (40, 50).

18 Claims, 2 Drawing Sheets

HIGH INTEGRATION ELECTRONIC ASSEMBLY AND METHOD

FIELD OF THE INVENTION

The present invention relates to an automotive anti-lock braking system and, more particularly, to a connector assembly for use with the automotive anti-lock braking system.

BACKGROUND OF THE INVENTION

A conventional anti-lock braking system integrates an electronic control assembly with the braking system's motor connector and main hydraulic control connector. The conventional main connector has a solenoid valve assembly press-fit onto valve stems in a separate hydraulic control unit. This assembly is, in turn, connected to an electronic controller via a wiring harness.

Typically, pins on the motor connector and main connector are mechanically fixed for alignment, set into position on one side of a circuit board, inserted into apertures on the one side of the circuit board, and then the distal ends of the pins are soldered directly to the other side of the circuit board of the electronic control assembly to electrically and mechanically secure them in place on the electronic control assembly.

An electronic control assembly that takes up less space while meeting all of the functional requirements of a conventional anti-lock braking system would beneficially reduce the space taken up by the entire anti-lock braking system.

SUMMARY OF THE INVENTION

In accordance with one feature of the present invention, an assembly comprises a circuit board, a first component, and a second component. The circuit board has a planar first surface and a planar second surface opposite the first surface. The first component has a first set of connectors. The first set of connectors engages a corresponding set of apertures in the first surface of the circuit board. The second component has a second set of mechanical one-way connectors. The second set of connectors engages a corresponding set of apertures in the second surface of the circuit board. The circuit board further has a normal axis perpendicular to both the first and second surfaces. The normal axis passes through both the first and second components.

In accordance with another feature of the present invention, an assembly is used with an anti-lock braking system. The assembly comprises a circuit board, a first component, and a second component. The circuit board has a first surface, a second surface opposite the first surface, and a plurality of electrical engagement holes. The holes are located at the first surface and the second surface. The first component has a first set of connectors. The first set of connectors engages a first set of the plurality of holes at the first surface. The second component has a second set of mechanical one-way connectors. The second set of connectors engages a second set of the plurality of holes at the second surface. The circuit board has a normal axis perpendicular to both the first and the second surfaces. The normal axis passes through the first component and the second component.

In accordance with still another feature of the present invention, an assembly is used with an anti-lock braking system. The assembly comprises a circuit board means, a first connecting means, and a second connecting means. The circuit board means provides electrical connection and support to a first component and a second component. The circuit board means has a first surface and a second surface opposite the first surface. The first connecting means connects the first component to the first surface of the circuit board means. The second connecting means connects the second component to the second surface of the circuit board means. The circuit board means has a normal axis perpendicular to both the first and the second surfaces. The normal axis passes through both the first component and the second component.

In accordance with yet another feature of the present invention, a method secures electric components of an anti-lock braking system. The method comprises the steps of mounting a first component to a first surface of a circuit board for electrically engaging the circuit board, and mounting a second component to a second surface of the circuit board for electrically engaging the circuit board. The mounting of the first component includes the step of inserting at least one mechanical one-way connector into a first side of the circuit board. The mounting of the second component includes the step of inserting at least one mechanical one-way connector into a second side of the circuit board such that at least one of the connectors extends from the first component toward the second component and at least one other of the connectors extends from the second component toward the first component.

BRIEF DESCRIPTION OF THE DRAWINGS

The foregoing and other features and advantages of the present invention will become more apparent to one skilled in the art upon consideration of the following description of the invention and the accompanying drawings, in which.

DESCRIPTION OF AN EXAMPLE EMBODIMENT

Figure 1:
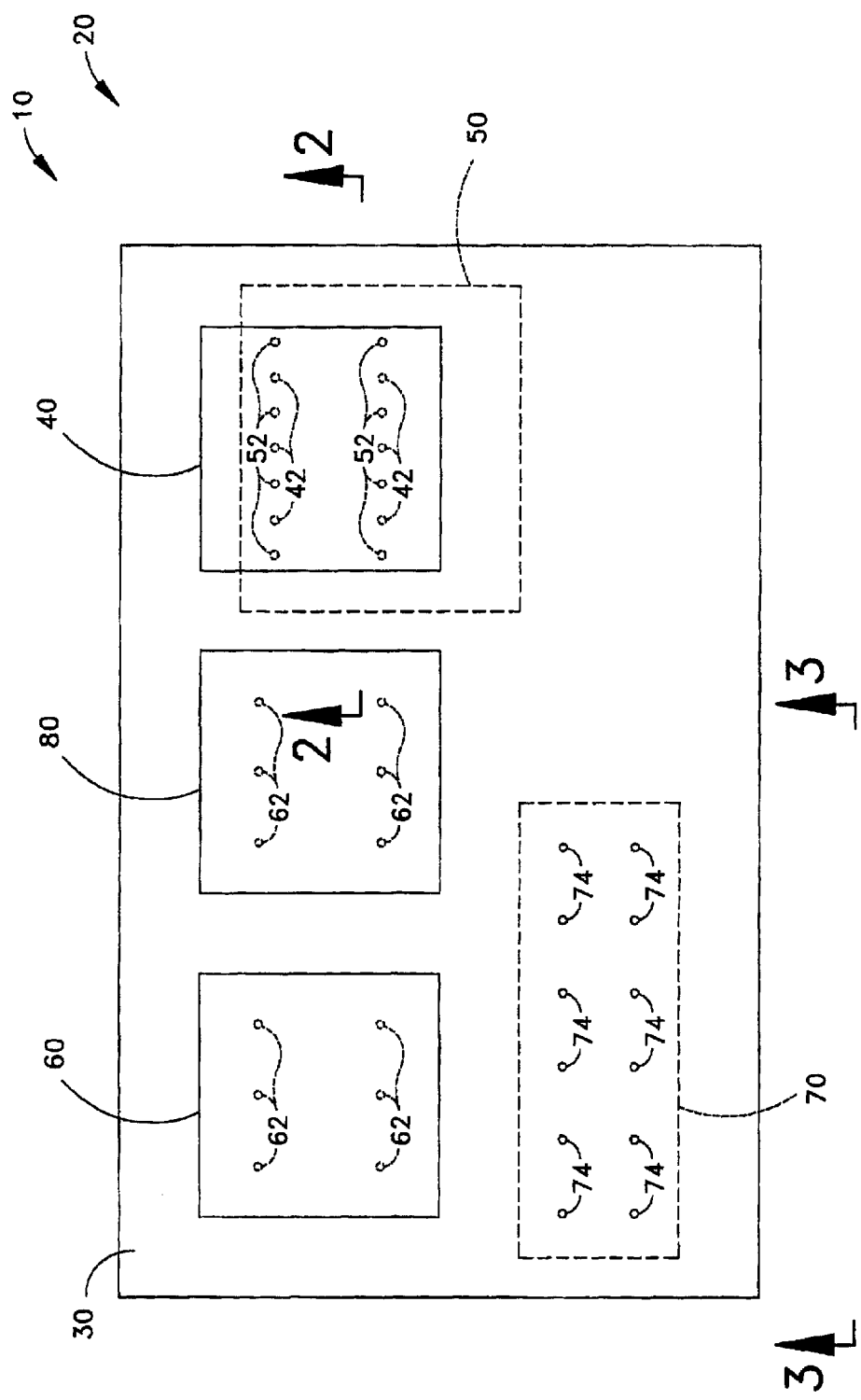
FIG. 1 is a schematic view of an assembly in accordance with the present invention.

In one example in accordance with the present invention, an anti-lock braking system 10 includes an integrated electronic assembly 20. The assembly 20 comprises a printed circuit board 30, a first component 40, a second component 50, a third component 60, a fourth component 70, and a fifth component 80. The first component 40 may be a main connector for the anti-lock braking system 10. The second component 50 may be a motor connector for the anti-lock braking system 10. The third, fourth, and fifth components 60, 70, 80 may be other components for the anti-lock braking system 10.

The circuit board 30 has a planar first surface 32 and a planar second surface 34 opposite the first surface. The first component 40 has a first set of mechanical one-way connectors 42, such as non-soldered compliant pins. The first set of connectors 42 engages a corresponding set of apertures, or engagement holes 36, in the first surface 32 of the circuit board 30. The second component 50 has a second set of mechanical one-way connectors 52, such as non-soldered compliant pins. The second set of connectors 52 engages a corresponding set of apertures, or engagement holes 38, in the second surface 34 of the circuit board 30. The use of non-soldered connectors allows both sides of the circuit board 30 to electrically and mechanically secure components to the circuit board 30 since the reverse sides of the circuit board do not require access for a securing process such as soldering.

The circuit board 30 further has a normal axis 39 perpendicular to both the first and second surfaces 32, 34. The normal axis 39 passes through both the first and second components 40, 50. The circuit board 30 thereby provides means for electrical connection and support to the first component 40 and the second component 50.

Figure 2:
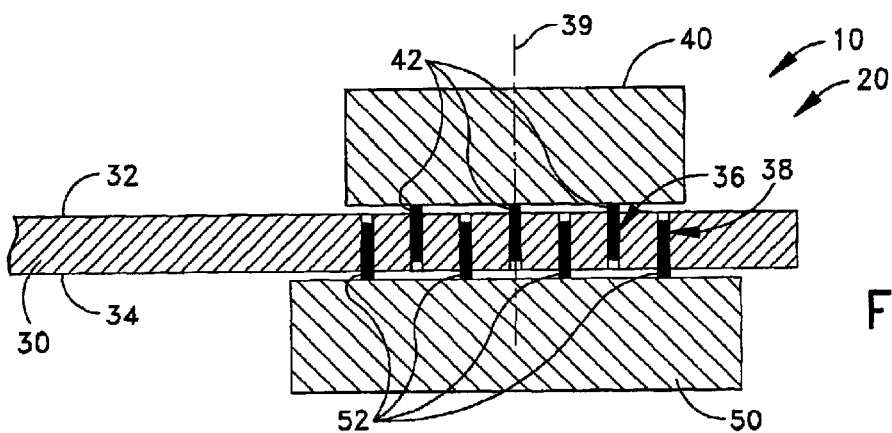
FIG. 2 is a schematic section view taken along line 2—2 in FIG. 1.

As viewed in FIGS. 1 and 2, the first set of connectors 42 may be interposed between the second set of connectors 52 such that the first component 40 and the second component 50 may overlay each other, as viewed in FIG. 1. This arrangement may allow the circuit board 30 to be up to half the size of a circuit board utilizing the conventional arrangement (i.e., one sided mounting).

Figure 3:
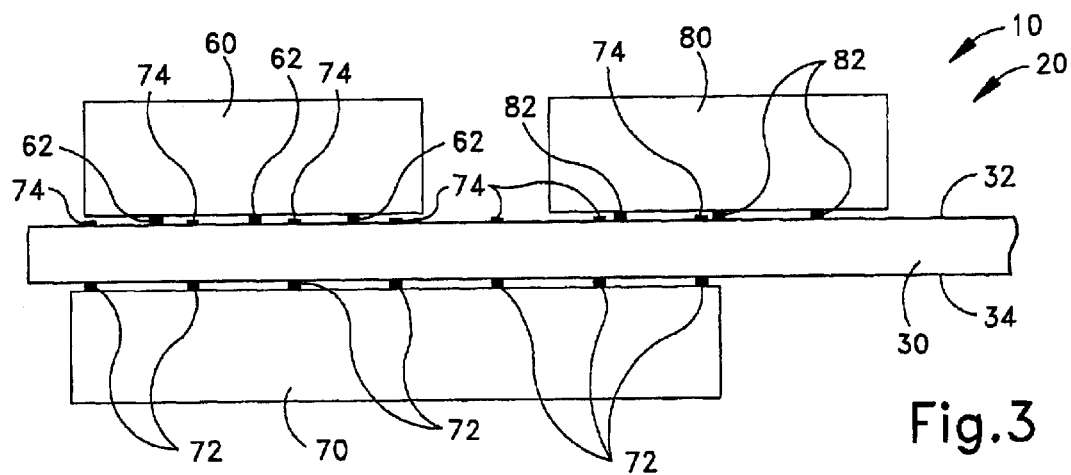
FIG. 3 is a schematic section view taken along line 3—3 in FIG. 1.

As viewed in FIGS. 1 and 3, the mounting of the third component 60 and fifth component 80 on the first surface 32 of the circuit board 30 and the fourth component 70 on the second surface 34 of the circuit board allows greater access to the components than the conventional arrangement, even though the third, fourth, and fifth components 60, 70, 80 do not overlay each other.

The third component 60 has a third set of connectors 62, such as non-soldered compliant pins or solderable pins. The fourth component 70 has a fourth set of connectors 72, such as non-soldered compliant pins or solderable pins. The fifth component 80 has a fifth set of connectors 82, such as non-soldered compliant pins or solderable pins.

A hybrid arrangement of both solderable pins and compliant pins may be used with the assembly 20. As viewed in FIG. 3, for example, the fourth component 70 may have solderable pins and may be mounted to the second surface 34 of the circuit board 30 and secured to the circuit board by solder 74 on the first surface 32. Subsequently, the third and fifth components 60, 80 may be secured to the first surface 32 of the circuit board 30 with compliant pins. Since the compliant pins plastically deform for securing to the circuit board 30, no access to the second surface 34 is necessary when mounting the third component 60 and the fifth component 80 to the first surface 32 of the circuit board. A circuit board 30 with equal capability and smaller size than the conventional circuit board is still produced. This hybrid arrangement may also be used with the interposed pins 42, 52 of the first and second components 40, 50 (FIG. 2) for even greater utilization of space on the circuit board 30.

In accordance with another feature of the present invention, a method secures the first and second components 40, 50 of the anti-lock braking system 10. The method comprises the steps of: mounting the first component 40 to the first surface 32 of the circuit board 30 for electrically engaging the circuit board; and mounting the second component 50 to the second surface 34 of the circuit board for electrically engaging the circuit board. The mounting of the first component 40 includes the step of inserting at least one mechanical one-way connector 42 into the first surface 32 of the circuit board 30. The mounting of the second component 50 includes the step of inserting at least one mechanical one-way connector 52 into the second surface 34 of the circuit board 30 such that at least one of the connectors 42 extends from the first component 40 toward the second component and at least one other of the connectors 52 extends from the second component toward the first component.

From the above description of the invention, those skilled in the art will perceive improvements, changes and modifications. Such improvements, changes and modifications within the skill of the art are intended to be covered by the appended claims.

Having described the invention, the following is claimed:

1. An assembly comprising:
   a circuit board having a planar first surface and a planar second surface opposite said first surface;
   a first component having a first set of connectors, said first set of connectors being the only connectors extending from said first component, said first connectors engaging a corresponding first set of apertures in said first surface of said circuit board; and
   a second component having a second set of mechanical one-way connectors, said second set of connectors being the only connectors extending from said second component, said second connectors engaging a corresponding second set of apertures in said second surface of said circuit board, each of said second set of apertures being separate and apart from each of said first set of apertures and said first connectors remain spaced from said second component and said second connectors remain spaced from said first component,
   at least one connector of one of said first set of connectors and said second set of connectors being alternately interposed between and adjacent to connectors of the other of said first set of connectors and said second set of connectors and said circuit board having a normal axis to both said first and second surfaces, said normal axis passing through both said first and second components.

2. The assembly as set forth in claim 1 wherein said first set of connectors are compliant pins.

3. The assembly as set forth in claim 2 wherein said second set of connectors are compliant pins.

4. The assembly as set forth in claim 1 wherein said first set of connectors are solder pins.

5. The assembly as set forth in claim 1 further including a third component engaging said first surface of said circuit board, said normal axis not passing through said third component.

6. The assembly as set forth in claim 5 further including a fourth connector engaging said second surface of said circuit board, said normal axis not passing through said fourth component.

7. An assembly for an anti-lock braking system, said assembly comprising:
   a circuit board having a first surface, a second surface opposite said first surface, and a plurality of electrical engagement holes, said holes being located at said first surface and said second surface;
   a first component having a first set of connectors, said first set of connectors being the only connectors extending from said first component, said first connectors engaging a first set of said plurality of holes at said first surface; and
   a second component having a second set of mechanical one-way connectors, said second set of connectors being the only connectors extending from said second component, said second connectors engaging a second set of said plurality of holes at said second surface, each of said first set of said plurality of holes being different than each of said second set of said plurality of holes and said first connectors remain spaced from said second component and said second connectors remain spaced from said first component,
   at least one connector of one of said first set of connectors and said second set of connectors being alternately interposed between and adjacent to connectors of the other of said first set connectors and said second set of connectors and said circuit board having a normal axis to both said first and said second surfaces, said normal axis passing through said first component and said second component.

8. The assembly as set forth in claim 7 wherein said first set of connectors are compliant pins.

9. The assembly as set forth in claim 8 wherein said second set of connectors are compliant pins.

10. The assembly as set forth in claim 7 wherein said first set of connectors are solder pins.

11. An assembly for an anti-lock braking system, said assembly comprising:

circuit board means for providing electrical connection and support to a first component and a second component, said circuit board means having a first surface and a second surface opposite said first surface;

first connecting means for electrically connecting the first component to the first surface of said circuit board means, said first connecting means extending from said first component and providing the only electrical connection between said first component and said circuit board; and second connecting means for electrically connecting the second component to the second surface of said circuit board means, said second connecting means extending from said second component and providing the only electrical connection between said second component and said circuit board, and said second connecting means being separate and apart from said first connecting means, at least one connector of one of said first set of connectors and said second set of connectors being alternately interposed between and adjacent to connectors of the other of said first set of connectors and said second set of connectors and said circuit board having a normal axis to both said first and second surfaces, said normal axis passing through both said first and second components.

12. The assembly as set forth in claim 11 wherein said first connecting means includes compliant pins.

13. The assembly as set forth in claim 12 wherein said second connecting means includes compliant pins.

14. The assembly as set forth in claim 11 wherein said first connecting means includes a first set of connectors.

15. The assembly as set forth in claim 14 wherein said second connecting means includes a second set of connectors.

16. The assembly as set forth in claim 15 wherein one of said first set of connectors and said second set of connectors are interposed between the other of said first set of connectors and said second set of connectors.

17. The assembly as set forth in claim 14 wherein said first set of connectors are solder pins.

18. A method for securing electric components of an anti-lock braking system, said method comprising the steps of:

mounting a first component to a first surface of a circuit board for electrically engaging the circuit board; and mounting a second component to a second surface of the circuit board for electrically engaging the circuit board, said mounting of the first component including the step of inserting all first mechanical one-way connectors extending from said first component only into associated first mounting holes in a first side of the circuit board, said mounting of the second component including the step of inserting all second mechanical one-way connectors extending from said second component only into associated second mounting holes in a second side of the circuit board such that said first mechanical one way connectors extend from the first component toward the second component and provide the only electrical connection of the first component to the circuit board and said second mechanical one way connectors extend from the second component toward the first component and provide the only electrical connection of the second component to the circuit board, none of said first mechanical one way connectors and said second mechanical one way connectors sharing the same mounting holes and at least one connector of one of said first mechanical one-way connectors and said second mechanical one-way connectors being alternately interposed between and adjacent to connectors of the other of said first mechanical one-way connectors and said second mechanical one-way connectors and said circuit board having a normal axis to both said first and second surfaces, said normal axis passing through both said first and second components.

* * * * *